United States Patent
Kula et al.

(10) Patent No.: US 8,921,961 B2
(45) Date of Patent: Dec. 30, 2014

(54) STORAGE ELEMENT FOR STT MRAM APPLICATIONS

(75) Inventors: Witold Kula, Sunnyvale, CA (US);
Guenole Jan, San Jose, CA (US);
Ru-Ying Tong, Los Gatos, CA (US);
Yu-Jen Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/617,432

(22) Filed: Sep. 14, 2012

(65) Prior Publication Data

US 2014/0077318 A1   Mar. 20, 2014

(51) Int. Cl.
*H01L 29/82* (2006.01)
*H01L 21/02* (2006.01)
*H01L 21/00* (2006.01)

(52) U.S. Cl.
USPC ................. 257/421; 257/295; 438/2; 438/3

(58) Field of Classification Search
CPC .............................. H01L 29/82; H01L 21/02
USPC .................................. 257/421, 295; 438/2, 3
See application file for complete search history.

(56) References Cited

U.S. PATENT DOCUMENTS

| | | | |
|---|---|---|---|
| 6,469,926 B1 * | 10/2002 | Chen ............................ 365/158 |
| 6,956,257 B2 | 10/2005 | Zhu et al. |
| 7,002,228 B2 | 2/2006 | Deak et al. |
| 7,598,555 B1 * | 10/2009 | Papworth Parkin .......... 257/295 |
| 7,948,044 B2 | 5/2011 | Horng et al. |
| 8,217,478 B2 | 7/2012 | Lou et al. |
| 2004/0101978 A1 * | 5/2004 | Linn et al. ......................... 438/3 |
| 2005/0226043 A1 * | 10/2005 | Parkin et al. .................. 365/173 |
| 2006/0255383 A1 * | 11/2006 | Kaiser et al. .................. 257/295 |
| 2007/0148786 A1 * | 6/2007 | Horng et al. ...................... 438/2 |
| 2008/0088980 A1 | 4/2008 | Kitagawa et al. |
| 2008/0278867 A1 * | 11/2008 | Fukumoto et al. ........ 360/324.12 |
| 2010/0096716 A1 | 4/2010 | Ranjan et al. |
| 2011/0045318 A1 | 2/2011 | Lee et al. |
| 2012/0175717 A1 | 7/2012 | Bessho et al. |
| 2012/0205758 A1 | 8/2012 | Jan et al. |

OTHER PUBLICATIONS

PCT Search Report, PCT/US2013/059656, Mailed: Jan. 22, 2014, Headway Technologies, Inc.

* cited by examiner

*Primary Examiner* — Long K Tran
*Assistant Examiner* — Dzung Tran
(74) *Attorney, Agent, or Firm* — Saile Ackerman LLC; Stephen B. Ackerman

(57) ABSTRACT

An improved PMA STT MTJ storage element, and a method for forming it, are described. By inserting a suitable oxide layer between the storage and cap layers, improved PMA properties are obtained, increasing the potential for a larger Eb/kT thermal factor as well as a larger MR. Another important advantage is better compatibility with high processing temperatures, potentially facilitating integration with CMOS.

20 Claims, 2 Drawing Sheets

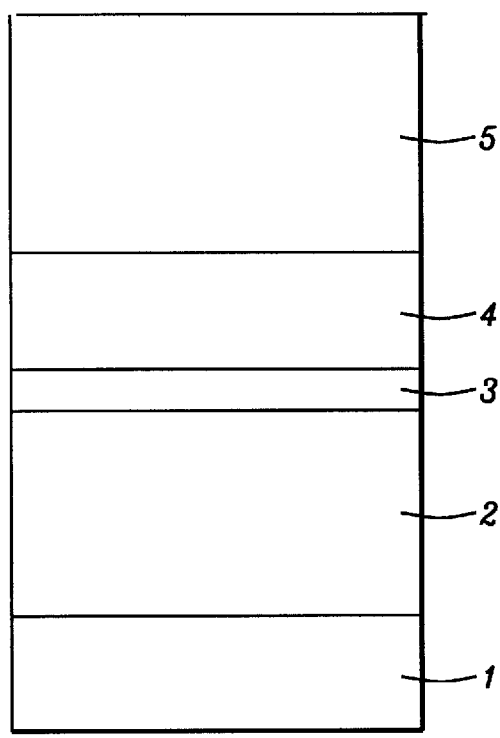
FIG. 1 - Prior Art
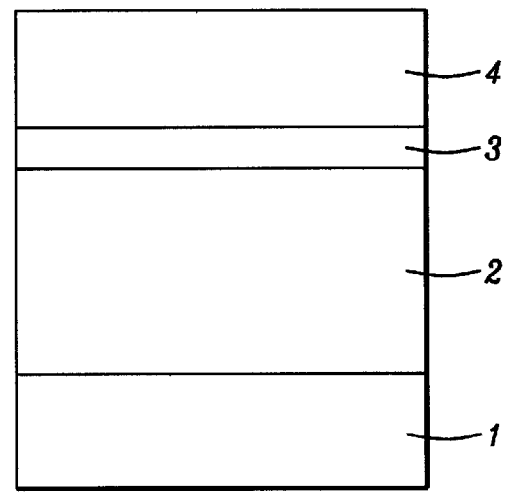
FIG. 2
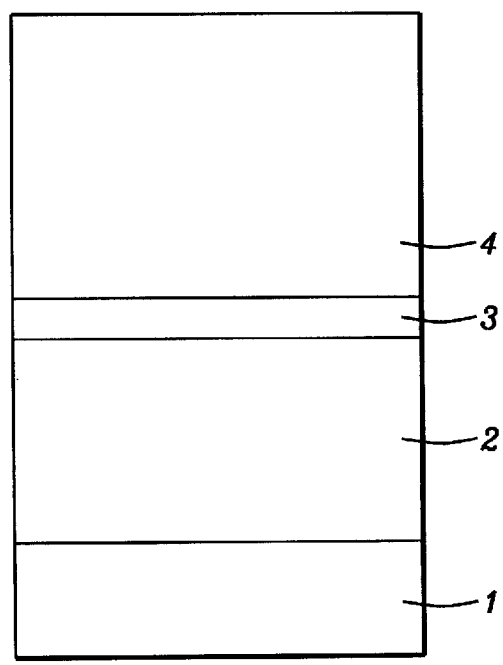
FIG. 3

STORAGE ELEMENT FOR STT MRAM APPLICATIONS

TECHNICAL FIELD

The disclosed structure relates to the Spin Transfer Torque Magnetic Random Access Memory (STT MRAM) including its implementation via Magnetic Tunnel Junction (MTJ) elements with Perpendicular Magnetic Anisotropy (PMA), i.e. the magnetization of the free layer and of the reference layer being perpendicular to the plane of the films.

BACKGROUND

Among the critical requirements for PMA STT MRAM MTJ storage is to provide (1) a strong PMA, implying a high magnetocrystalline anisotropy field (Hk) to ensure a high thermal stability factor Eb/kT, (2) a high magnetoresistance ratio (MR), and (3) preferably, compatibility with high-temperature processing at or above 300° C. (which helps to increase the MR for the most commonly used MgO-based MTJs).

PMA STT storage elements proposed to date typically utilize Co- and/or Fe-based magnetic layers or multilayers, most commonly a CoFeB-based layer, grown on top of the MgO MTJ tunnel barrier. An example is shown in FIG. 1. Represented there as layer 1 are the MTJ bottom layers (seed layer, antiferromagnetic layer etc.). Layer 2 is the reference layer, in contact with magnesia tunnel barrier layer 3 whose upper side is contacted by (free) storage layer 4.

The PMA of storage layer 4 is induced by the interfacial anisotropy at the MgO/storage layer interface where the lattice mismatch between layers 3 and 4 generates strain at their interface. Completing this prior art design is protective cap layer 5 most commonly made of Ta and selected to not deteriorate the storage layer's magnetic and magnetoresistive properties.

Such storage layer designs, however, suffer from several drawbacks, including (1) a weak PMA as a consequence of being induced at only one interface and thus not allowing magnetic elements, such as CoFeB, to be thick enough for Eb to maximize the MR, and (2) making possible diffusion of cap layer material into the storage layer and/or the MgO barrier during processing at or above 300° C., resulting in loss of PMA and/or MR.

While there have been attempts at mitigating drawback (1), by applying a cap layer that provides additional interfacial anisotropy, there remains a need to further improve the strength of the storage layer's PMA. Drawback (2) remains largely unaddressed in the designs that are currently being described in the prior art.

SUMMARY

It has been an object of at least one embodiment of the present disclosure to provide an MTJ having enhanced PMA.

Another object of at least one embodiment of the present disclosure has been to provide an MTJ having increased high temperature stability together with an increased MR.

Still another object of at least one embodiment of the present disclosure has been to provide a method to manufacture said MTJ.

A further object of at least one embodiment of the present disclosure has been that said method be compatible with existing methods for manufacturing MTJs.

These objects have been achieved by inserting a suitable oxide layer between the storage and cap layers. This oxide layer, which is native to the materials making up the storage layer, can be formed through natural oxidation of the top surface of the storage layer or it may be deposited thereon using a standard deposition technique.

The inserted oxide layer introduces anisotropic vertical strain at its interface with the storage layer which induces additional PMA in the storage layer, over and above the PMA originating at the storage layer-to-barrier layer interface that is already present in the storage layer.

BRIEF DESCRIPTION OF THE DRAWINGS

FIG. 1 shows a magnetic tunnel junction storage device, of the prior art, that includes PMA.

FIG. 2 shows how PMA in the device of FIG. 1 can be enhanced by inserting an oxide layer that contacts the storage layer.

FIG. 3 illustrates formation of the oxide layer

DETAILED DESCRIPTION

The subject of this disclosed structure is an improved and simplified storage element for the PMA STT MRAM that provides enhanced interfacial PMA, thus allowing for thicker storage elements and higher Eb, which are important for practical realization of high-density high-performance STT MRAM products.

As shown schematically in FIG. 2, the structure that is disclosed here includes magnetic layer (or multilayer) 20 that contacts MgO tunnel barrier 3 and has a thickness in a range of between about 1 and 5 nanometers, with a thickness between about 1.5 and 3 nanometers being preferred. This is then contacted by layer 21 of an oxide that is native to (i.e. derived from) the magnetic material(s) that make up the topmost portions of layer 20 (typically material that was within about 6 Angstroms from the top surface of layer 20 before layer 21 was formed either through deposition onto layer 20 or through the oxidation of above-mentioned part of layer 20.

The preferred process for forming layer 21 was natural oxidation of the top portion of layer 20. Details of this oxidation process (which is schematically illustrated in FIG. 3) were as follows: Layer 20 was exposed to an 18 SCCM oxygen flow for about 30 seconds in an evacuated (pumped) vacuum chamber. Natural oxidation was generally preferred because this process generates a unique stress and strain pattern in the magnetic element which further enhances the interfacial PMA properties.

However, the added top oxide layer could have been made by any of several other methods, including, but not limited to, radical oxidation, reactive physical deposition in the presence of oxygen or direct deposition of the oxide through physical or chemical deposition.

Figure 4:
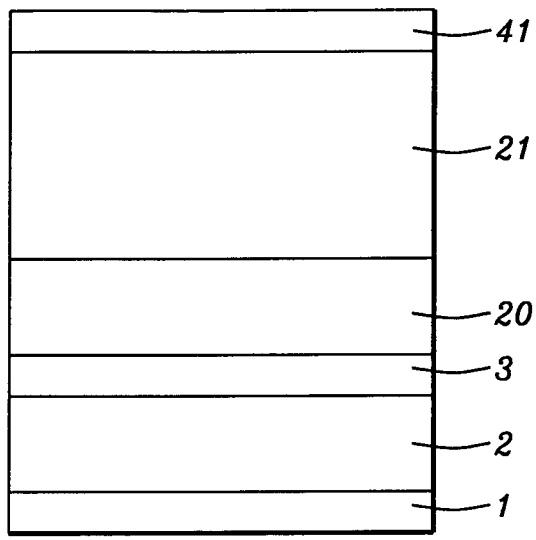
FIG. 4 shows the relative positions of the oxide and storage layers

As illustrated in FIG. 4, to preserve its properties, the structure was then covered with protective layer 41 of a material such as Ru or _Cu, Pt, Pd, Co, Rh, Ag, and Au that have an affinity to oxygen lower than that of layer 21.

Figure 5:
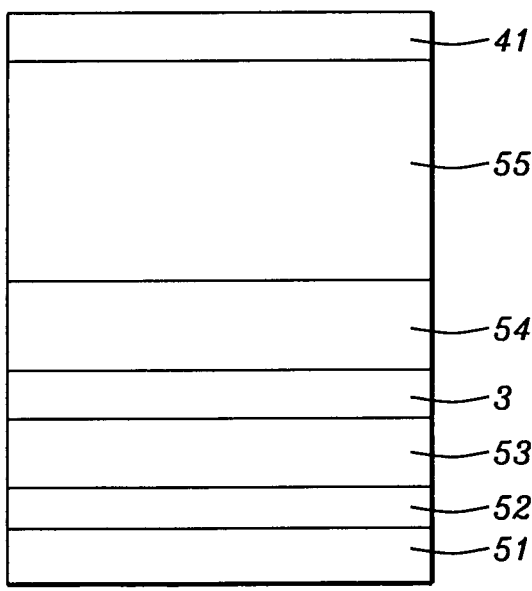
FIG. 5 shows a preferred embodiment of the disclosed structure

In FIG. 5 we show a preferred embodiment of the disclosed structure. It was made up of the following elements:

Layer 51: TaN _20 A/Mg 7 A
Layer 52: NiCr 50 A
Layer 53: [Ni6/Co2.5]×4/Ru 4 A/Co20Fe60B20 8 A
Layer 3: MgO 10 A
Layer 54: Co20Fe60B 16 A Layer 55: Co20Fe60B Oxide ~6 A
Layer 41: Ru 50 A It should be noted that although CoFeB has been cited as the material used for layer 20, it could be replaced with other magnetic materials including Co, Fe, Ni, their alloys, as well as their alloys with Boron, Si or other Ms-diluting element without removing the advantages offered by the disclosed structure.

High Temperature Stability:

The structure shown in FIG. 5, was annealed at 300° C. for 10 minutes, following which its primary characteristics were measured. It was found that the PMA properties were preserved up to a large magnetic thickness of the CoFeB layer (at least 22 Å in this case), thus indicating that a very strong interfacial PMA had been induced. This PMA is much stronger than that found in prior-art structures, similar to FIG. 1 but with a Ta cap, for which the maximum CoFeB thickness that can be used is 14 Å. The advantage of a thicker CoFeB in the storage element is that it helps to increase Eb and to maximize the MR.

It should also be noted that the presence of top oxide layer 21 can introduce a series parasitic resistance in the storage element, thus lowering the effective MTJ MR. The thickness of the oxide layer should therefore be kept small, preferably <10 Å, or other measures intended to lower its resistance should be adopted. Examples include doping the oxide or the magnetic layer before oxidation with additional conducting elements like Cu, or etching back the formed oxide using plasma treatment.

It should additionally be noted that although the benefits of the disclosed structure are most apparent for the PMA STT MRAM, the basic approach taught in this disclosure can also be advantageously applied for the In-Plane STT MRAM where it could be used to lower the Out-of-Plane magnetic anisotropy of the In-Plane storage element, thus lowering the its critical current for switching.

What is claimed is:

1. A method to form a magnetic tunnel junction (MTJ) having enhanced Perpendicular Magnetic Anisotropy (PMA), comprising:
    providing a substrate and depositing thereon a first ferromagnetic layer that is magnetized in a fixed direction, thereby enabling said first ferromagnetic layer to be a reference layer;
    depositing a tunnel barrier layer onto said reference layer;
    depositing onto said tunnel barrier layer a magnetic storage layer that induces interfacial anisotropy at its interface with said tunnel barrier layer, thereby inducing PMA within said magnetic storage layer;
    forming a native oxide layer on, and in contact with, said magnetic storage layer, said native oxide layer resulting from an oxidation of an upper portion of said magnetic storage layer and said native oxide layer, thereby, comprising oxygen and elements present in an upper portion of said magnetic storage layer, thereby inducing additional PMA within said magnetic storage layer; and
    depositing on said native oxide layer a capping layer of material whose affinity for oxygen is less than that of said native oxide layer.

2. The method recited in claim 1 wherein said tunnel barrier layer is magnesia.

3. The method recited in claim 1 wherein said storage layer further comprises elements selected from the group consisting of Fe, Ni, Co, B, and their alloys or multilayers which can also include a non-magnetic material such as Pt, Pd, Ru, Rh, Mo, and V.

4. The method recited in claim 1 wherein said upper portion of said storage layer extends downwards from an upper surface of said storage layer for a distance in a range of from 2 to 15 Angstroms.

5. The method recited in claim 1 wherein said native oxide layer is formed through natural oxidation of said upper portion of said storage layer.

6. The method recited in claim 5 wherein the step of natural oxidation further comprises exposure to an 18 SCCM oxygen flow for about 30 seconds in an evacuated vacuum chamber.

7. The method recited in claim 1 wherein said native oxide layer is formed through deposition using a technique selected from the group consisting of physical deposition, chemical deposition, radical oxidation, and reactive physical deposition.

8. The method recited in claim 1 wherein, as a consequence of said enhanced PMA, said MTJ has an increased magnetoresistance ratio as well as being stable in temperatures up to 300° C.

9. The method recited in claim 1 further comprising reducing series resistance due to said native oxide layer by doping said native oxide layer with a conduction enhancing element.

10. The method recited in claim 1 further comprising reducing series resistance due to said native oxide layer by etching back said native oxide layer.

11. A magnetic tunnel junction (MTJ) having enhanced Perpendicular Magnetic Anisotropy (PMA), comprising:
    on a substrate, a first ferromagnetic layer that is magnetized in a fixed direction, whereby said first ferromagnetic layer is a reference layer;
    a tunnel barrier layer on said reference layer;
    on, and contacting, said tunnel barrier layer, a magnetic storage layer that induces interfacial anisotropy at its interface with said tunnel barrier layer, whereby PMA is present in said magnetic storage layer;
    a native oxide layer on, and in contact with, said magnetic storage layer, said native oxide layer being the oxidation of an upper portion of said magnetic storage layer and, said native oxide layer thereby, comprising oxygen and elements present in an upper portion of said magnetic storage layer, whereby said magnetic storage layer has enhanced PMA; and
    on said native oxide layer, a capping layer of material whose affinity for oxygen is less than that of said native oxide layer.

12. The MTJ described on claim 11 wherein said tunnel barrier layer is magnesia.

13. The MTJ described on claim 11 wherein said storage layer further comprises elements selected from the group consisting of Fe, Ni, Co, B, and their alloys or multilayers which can also include a non-magnetic material such as Pt, Pd, Ru, Rh, Mo, and V.

14. The MTJ described on claim 11 wherein, as a consequence of said enhanced PMA, said MTJ has an increased magnetoresistance ratio as well as being stable at temperatures up to 300° C.

15. The MTJ described on claim 11 wherein said upper portion of said storage layer extends downwards from an upper surface of said storage layer for a distance in a range of from 2 to 15 Angstroms.

16. The MTJ described on claim 11 wherein said substrate includes a seed layer.

17. The MTJ described on claim 11 wherein said a reference layer further comprises elements selected from the group consisting of Fe, Ni, Co, and their alloys or multilayers which can also include a non-magnetic material such as Pt, Pd, Ru, Rh, Mo, and V.

18. The MTJ described on claim 11 wherein said a tunnel barrier layer has a thickness in a range of from 5 to 20 Angstroms.

19. The MTJ described on claim 11 wherein said native oxide layer has a thickness in a range of from 2 to 15 Angstroms.

20. The MTJ described on claim 11 wherein said capping layer further comprises elements selected from the group consisting of Ru, Cu, Pt, Pd, Rh, Ag, Au and other materials with a high energy of oxide formation.

* * * * *